(12) United States Patent
Webster

(10) Patent No.: US 10,677,818 B1
(45) Date of Patent: Jun. 9, 2020

(54) DUAL CIRCUIT CURRENT LOADING ANALYSIS APPARATUS

(71) Applicant: Cardell Damian Webster, Lakewood, CO (US)

(72) Inventor: Cardell Damian Webster, Lakewood, CO (US)

( * ) Notice: Subject to any disclaimer, the term of this patent is extended or adjusted under 35 U.S.C. 154(b) by 45 days.

(21) Appl. No.: 16/012,581

(22) Filed: Jun. 19, 2018

Related U.S. Application Data

(60) Provisional application No. 62/521,813, filed on Jun. 19, 2017.

(51) Int. Cl.
| | |
|---|---|
| *G01R 15/12* | (2006.01) |
| *G01R 1/04* | (2006.01) |
| *G01R 13/02* | (2006.01) |
| *G01R 19/25* | (2006.01) |
| *G01D 11/24* | (2006.01) |

(52) U.S. Cl.
CPC .......... *G01R 15/125* (2013.01); *G01D 11/24* (2013.01); *G01R 1/04* (2013.01); *G01R 13/02* (2013.01); *G01R 19/25* (2013.01)

(58) Field of Classification Search
CPC ... G01R 1/00; G01R 1/02; G01R 1/04; G01R 11/00; G01R 11/24; G01R 13/00; G01R 13/02; G01R 13/0209; G01R 13/0227; G01R 15/00; G01R 15/12; G01R 15/125; G01R 15/14; G01R 15/144; G01R 15/146; G01R 19/00; G01R 19/25; G01R 19/2503; G01R 27/00; G01R 27/02; G01R 27/08; G01R 31/00; G01R 31/02; G01R 31/021; G01R 31/024; G01R 31/025; G01R 31/08; G01R 31/28
USPC ... 324/76.11, 98, 99 R, 99 D, 500, 503, 508, 324/509, 512, 522, 600, 649, 691, 713, 324/715, 718; 702/1, 57, 64
See application file for complete search history.

(56) References Cited

U.S. PATENT DOCUMENTS

| | | | | |
|---|---|---|---|---|
| 4,332,469 A | * | 6/1982 | Wendland | G01J 1/42 356/222 |
| 4,379,990 A | * | 4/1983 | Sievers | G01R 31/007 320/123 |
| 5,122,733 A | * | 6/1992 | Havel | G01R 13/02 324/114 |
| 5,345,826 A | * | 9/1994 | Strong | G01N 3/08 73/826 |
| 5,701,309 A | * | 12/1997 | Gearhardt | G01R 31/31919 714/736 |
| 5,744,962 A | * | 4/1998 | Alber | G01R 31/3648 324/426 |
| 6,144,721 A | * | 11/2000 | Stephens | H04M 1/24 324/520 |

(Continued)

*Primary Examiner* — Hoai-An D. Nguyen
(74) *Attorney, Agent, or Firm* — Leavitt Eldredge Law Frim

(57) ABSTRACT

A dual circuit current loading analysis apparatus enables the efficient testing of an electrical circuit, particularly those in vehicular applications. The apparatus electrically loads two circuits simultaneously and compares those readings to a battery or power source. Circuit input ports and ports to attach to the positive and negative sides of the battery are provided and attached to a microcontroller, voltage measurement device and load test device. The results of the test are indicated on a display and LEDs.

2 Claims, 4 Drawing Sheets

(56) References Cited

U.S. PATENT DOCUMENTS

| | | | |
|---|---|---|---|
| 2009/0119542 A1* | 5/2009 | Nagashima | G06F 11/261 714/33 |
| 2010/0072951 A1* | 3/2010 | Nakashima | H01M 2/16 320/145 |
| 2010/0156356 A1* | 6/2010 | Asakura | H01M 10/44 320/148 |
| 2010/0188050 A1* | 7/2010 | Asakura | G01R 31/025 320/136 |
| 2010/0259274 A1* | 10/2010 | Liu | G01R 31/34 324/502 |
| 2011/0099424 A1* | 4/2011 | Rivera Trevino | G06F 11/263 714/25 |
| 2011/0128027 A1* | 6/2011 | Watanabe | G01R 31/318511 324/756.01 |
| 2013/0049794 A1* | 2/2013 | Humphrey | G01R 31/40 324/764.01 |
| 2019/0049509 A1* | 2/2019 | Warmack | G01R 31/026 |

* cited by examiner

DUAL CIRCUIT CURRENT LOADING ANALYSIS APPARATUS

BACKGROUND

1. Field of the Invention

The present invention relates generally to circuit testing systems, and more specifically, to a dual circuit current loading analysis apparatus for determining failures or defects in electrical systems such as wiring or circuits.

2. Description of Related Art

Circuit testing systems are well known in the art and are effective means to isolate breaks or flaws in electrical systems. For example, FIG. 1 depicts a conventional multi-meter device 101 having a positive probe 103 and a negative probe 105 attached to a test device 107. The test device 107 having a digital display 109 where the results are shown. During use, the probes 103, 105 are touched to various places in a circuit allowing electricity to flow creating a result that is displayed.

One of the problems commonly associated with device 101 is its limited use. For example, the multi-meter device 101 can check for continuity, voltage or current and provide a numerical result, however the device 101 does not create a full electrical load on the circuit causing diagnosis errors.

Accordingly, although great strides have been made in the area of multi-meter devices, many shortcomings remain.

DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

Figure 1:
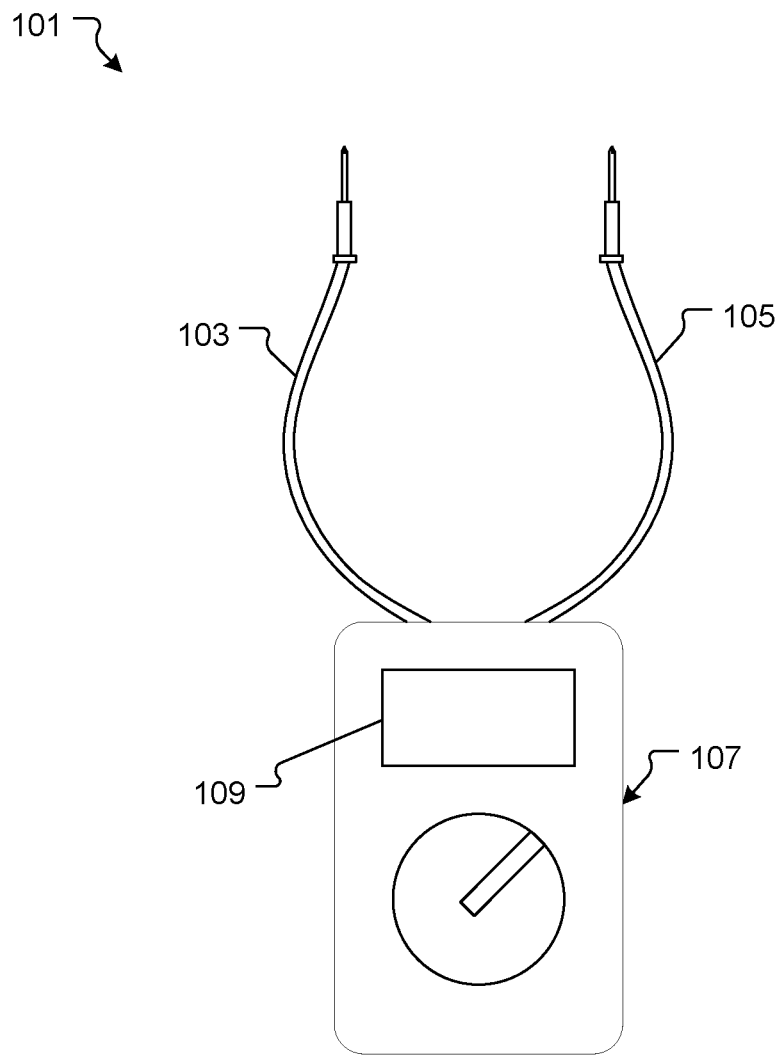
FIG. 1 is a top view of a common multi-meter device.

While the apparatus and method of use of the present application is susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the present application as defined by the appended claims.

DETAILED DESCRIPTION OF THE PREFERRED EMBODIMENT

Illustrative embodiments of the apparatus and method of use of the present application are provided below. It will of course be appreciated that in the development of any actual embodiment, numerous implementation-specific decisions will be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The apparatus and method of use in accordance with the present application overcomes one or more of the above-discussed problems commonly associated with conventional multi-meter devices. Specifically, the invention of the present application provides accurate results in both numerical and visual forms facilitating diagnosis of an electrical circuit. These and other unique features of the apparatus and method of use are discussed below and illustrated in the accompanying drawings.

The apparatus and method of use will be understood, both as to its structure and operation, from the accompanying drawings, taken in conjunction with the accompanying description. Several embodiments of the apparatus are presented herein. It should be understood that various components, parts, and features of the different embodiments may be combined together and/or interchanged with one another, all of which are within the scope of the present application, even though not all variations and particular embodiments are shown in the drawings. It should also be understood that the mixing and matching of features, elements, and/or functions between various embodiments is expressly contemplated herein so that one of ordinary skill in the art would appreciate from this disclosure that the features, elements, and/or functions of one embodiment may be incorporated into another embodiment as appropriate, unless described otherwise.

The preferred embodiment herein described is not intended to be exhaustive or to limit the invention to the precise form disclosed. It is chosen and described to explain the principles of the invention and its application and practical use to enable others skilled in the art to follow its teachings.

Figure 2:
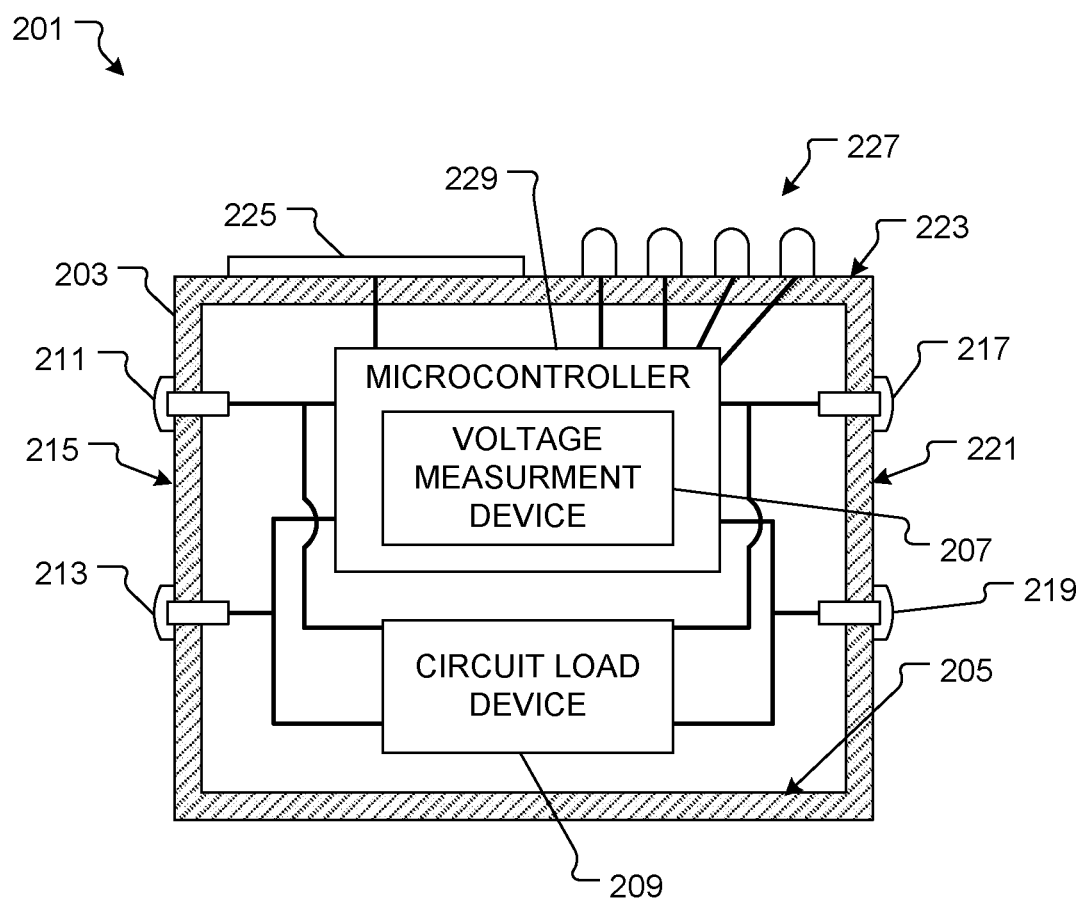
FIG. 2 is a cross-sectional side view of a dual circuit current loading analysis apparatus in accordance with a preferred embodiment of the present application.

Referring now to the drawings wherein like reference characters identify corresponding or similar elements throughout the several views, FIG. 2 depicts a cross-sectional side view of a dual circuit current loading analysis apparatus in accordance with a preferred embodiment of the present application. It will be appreciated that apparatus 201 overcomes one or more of the above-listed problems commonly associated with conventional multi-meter devices.

In the contemplated embodiment, apparatus 201 includes a housing 203 enclosing an inner compartment 205 wherein a voltage measurement device 207 and circuit load device 209 are housed. The voltage measurement device 207 in electric communication with a microcontroller 229.

The apparatus 201 includes a positive battery port 211 and a battery negative port 213 attached to a first side 215 of the housing 203. The battery ports 211, 213 in electric communication with the voltage measurement device 207 and the circuit load device 209.

The apparatus 201 includes a first circuit input port 217 and a second circuit input port 219 attached to a second side 221 of the housing 203. The circuit input ports 217, 219 in electric communication with the voltage measurement device 207 and the circuit load device 209.

The housing 203 having a digital display 225 attached to the top surface 223 and in electric communication with the voltage measurement device 207 and microcontroller 229. The top surface 223 also having LEDs 227 attached to the top surface and in electric communication with the voltage measurement device 207 and microcontroller 229.

In use, the battery ports 211, 213 are connected to the respective terminals of a battery or power source and the circuit input ports 217, 219 are attached to the circuits to be tested in place of the component. The load device 209 acts as a resistance to electrically load circuits connected to the circuit input ports 217, 219. The voltage measurement device 207 monitors and compares the voltage between the battery ports 211, 213 and the circuit input ports 217, 219. The results of the test are indicated by the display 225 and LEDs 227.

It should be appreciated that one of the unique features believed characteristic of the present application is that the apparatus 201 simultaneously evaluates two electrical circuits and compares the results to the battery or power source. It will also be appreciated that the digital display 225 and LEDs 227 provide a complete status of the tested circuits.

Figure 3:
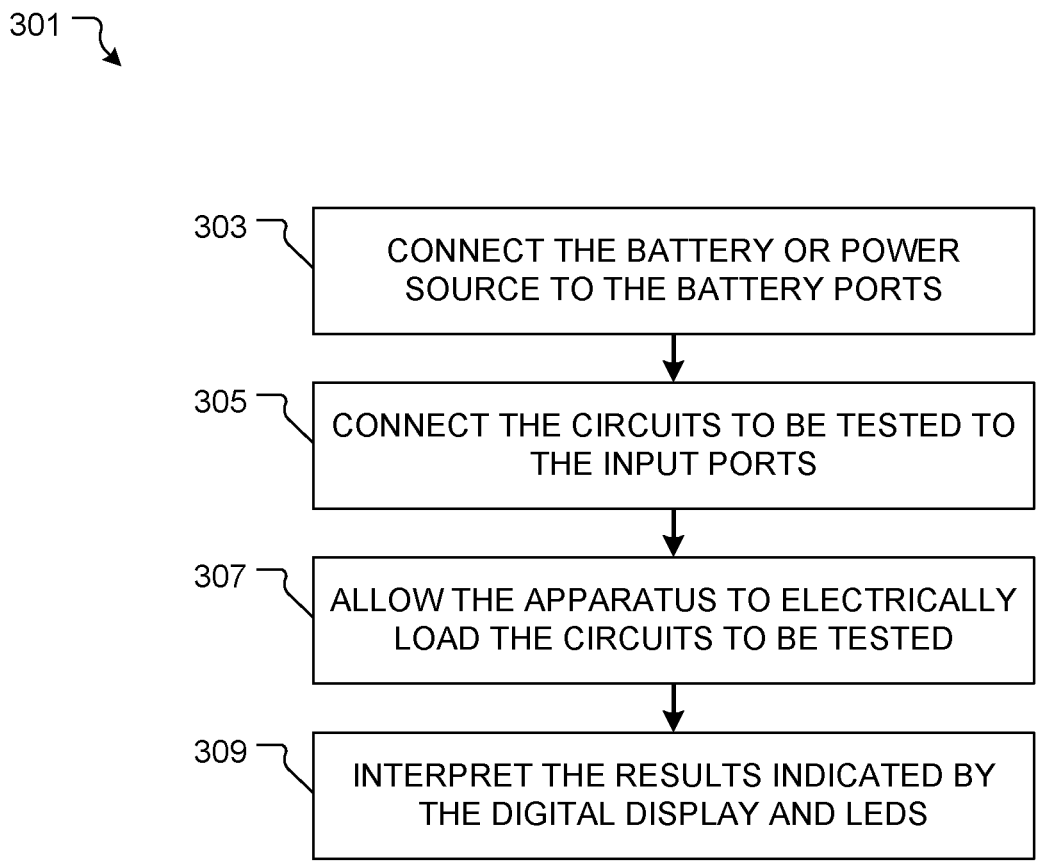
FIG. 3 is a flowchart of the preferred method of use of the apparatus of FIG. 2.

Referring now to FIG. 3 the preferred method of use of apparatus 201 is depicted. Method 301 including connecting the battery or power source to the battery ports 303, connecting the circuits to be tested to the circuit input ports 305, allowing the apparatus to electrically load the circuits to the component or in place of the component 307 and interpreting the results indicated by the digital display and LEDs 309.

Figure 4:
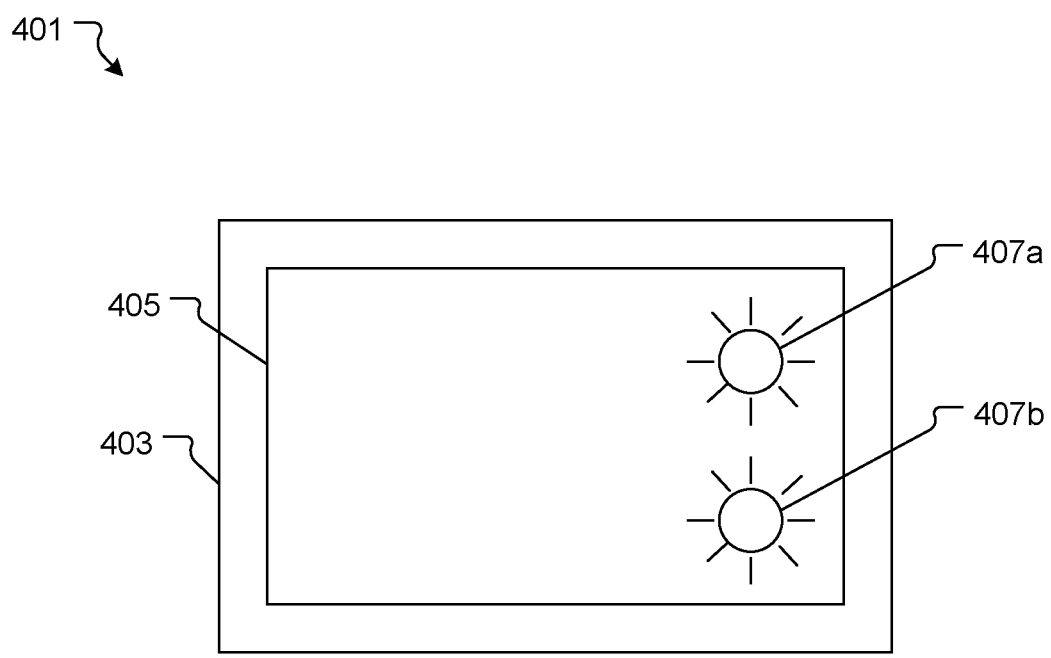
FIG. 4 is a top view of an alternative embodiment of the display of FIG. 2.

Referring now to FIG. 4 an alternative embodiment of the display 225 of FIG. is depicted. Embodiment 401 including a screen 403 having a display device 405 attached thereto in such a fashion as to allow light to pass through. It will be understood that in this embodiment 401 that there are no LEDs 227 but that display device 405 generates areas 407 or indicators that replace the LEDs 227 but function is the same manner. It will be appreciated that in this way the apparatus 201 requires fewer parts while still retaining the same function.

The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed:

1. A dual circuit current loading analysis apparatus comprising:
    a housing that encloses an inner compartment, the housing having four sidewalls including a first sidewall, a second sidewall, a front wall and a back wall;
    a microcontroller disposed within the inner compartment;
    a voltage measurement device separate from the microcontroller; and
    a circuit load device disposed within the inner compartment and separate from the microcontroller;
    a positive battery port and a negative battery port attached to the first sidewall of the housing and are conductively coupled to the voltage measurement device and the circuit load device;
    a first circuit input port and a second circuit input port attached to the second sidewall of the housing, the first circuit input port and the second input port are conductively coupled to both the voltage measurement device and the circuit load device; and
    a numerical display and LEDs disposed within the, inner compartment, the numerical display and the LEDs are conductively coupled to the microcontroller;
    wherein the device simulates an electrical load between the power source and at least two electrical circuits simultaneously to be tested and the results are indicated by the digital display and LEDs.

2. A method of analyzing a circuit comprising:
    providing the apparatus of claim 1;
    connecting the battery or power source to the battery ports;
    connecting the circuits to be tested to the circuit input ports;
    allowing the apparatus to electrically load the circuits to the component or in place of the component comparing the readings to the battery; and
    interpreting the results indicated by the digital display and LEDs.

* * * * *